United States Patent
Shieh et al.

(10) Patent No.: US 9,356,156 B2
(45) Date of Patent: May 31, 2016

(54) STABLE HIGH MOBILITY MOTFT AND FABRICATION AT LOW TEMPERATURE

(71) Applicants: Chan-Long Shieh, Paradise Valley, AZ (US); Gang Yu, Santa Barbara, CA (US); Fatt Foong, Goleta, CA (US); Juergen Musolf, Santa Barbara, CA (US)

(72) Inventors: Chan-Long Shieh, Paradise Valley, AZ (US); Gang Yu, Santa Barbara, CA (US); Fatt Foong, Goleta, CA (US); Juergen Musolf, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 294 days.

(21) Appl. No.: 13/902,514

(22) Filed: May 24, 2013

(65) Prior Publication Data

US 2014/0346495 A1    Nov. 27, 2014

(51) Int. Cl.
*H01L 29/786* (2006.01)
*H01L 29/66* (2006.01)
*H01L 29/423* (2006.01)

(52) U.S. Cl.
CPC .... *H01L 29/78693* (2013.01); *H01L 29/42384* (2013.01); *H01L 29/66742* (2013.01); *H01L 29/66969* (2013.01); *H01L 29/78603* (2013.01); *H01L 29/78606* (2013.01); *H01L 29/78696* (2013.01)

(58) Field of Classification Search
CPC ...................... H01L 29/7869; H01L 29/78693
See application file for complete search history.

(56) References Cited

U.S. PATENT DOCUMENTS

| | | | |
|---|---|---|---|
| 7,977,675 B2* | 7/2011 | Kawamura | H01L 27/1214 257/369 |
| 8,420,442 B2* | 4/2013 | Takechi | H01L 29/4908 438/104 |
| 2005/0275038 A1* | 12/2005 | Shih et al. | 257/382 |
| 2009/0035899 A1* | 2/2009 | Herman et al. | 438/151 |
| 2009/0057663 A1* | 3/2009 | Kim | H01L 29/78696 257/43 |
| 2009/0140243 A1* | 6/2009 | Kim | H01L 29/7869 257/43 |
| 2010/0006834 A1* | 1/2010 | Kim et al. | 257/43 |
| 2010/0051949 A1* | 3/2010 | Yamazaki et al. | 257/57 |
| 2010/0123128 A1* | 5/2010 | Jeon | H01L 29/78696 257/43 |
| 2011/0140100 A1* | 6/2011 | Takata et al. | 257/43 |
| 2012/0012840 A1* | 1/2012 | Korthuis | H01L 29/7869 257/43 |
| 2012/0112182 A1* | 5/2012 | Ishii et al. | 257/43 |
| 2012/0115276 A1* | 5/2012 | Hayashi et al. | 438/104 |
| 2013/0063675 A1* | 3/2013 | Misaki | 349/46 |

* cited by examiner

*Primary Examiner* — Benjamin Sandvik
(74) *Attorney, Agent, or Firm* — Robert A. Parsons; Michael W. Goltry; Parsons & Goltry

(57) ABSTRACT

A method of fabricating a stable high mobility amorphous MOTFT includes a step of providing a substrate with a gate formed thereon and a gate dielectric layer positioned over the gate. A carrier transport structure is deposited by sputtering on the gate dielectric layer. The carrier transport structure includes a layer of amorphous high mobility metal oxide adjacent the gate dielectric and a relatively inert protective layer of material deposited on the layer of amorphous high mobility metal oxide both deposited without oxygen and in situ. The layer of amorphous metal oxide has a mobility above 40 cm$^2$/Vs and a carrier concentration in a range of approximately 10$^{18}$ cm$^{-3}$ to approximately 5×10$^{19}$ cm$^{-3}$. Source/drain contacts are positioned on the protective layer and in electrical contact therewith.

26 Claims, 4 Drawing Sheets

STABLE HIGH MOBILITY MOTFT AND FABRICATION AT LOW TEMPERATURE

FIELD OF THE INVENTION

This invention generally relates to stable MOTFTs with high mobility and a process of fabrication at low temperature.

BACKGROUND OF THE INVENTION

There is presently a strong interest in metal oxide thin film transistors (MOTFT) because of the relatively high mobility in nanocrystalline or amorphous states. Also, in many applications, it is desirable to fabricate high mobility TFTs below certain temperatures so that flexible and/or organic substrates can be used. The active semiconductor layer in such TFTs must be formed/deposited at relatively low temperatures (e.g. room temperature) but which still has relatively high mobility and stability.

Poly-Si cannot be used for such active layer: the high mobility in poly-Si TFTs is achieved by an increase in the grain size to a level comparable to the channel length. Only a small number of grains exist in the channel region which leads to non-uniformity of devices because of its large statistical fluctuation. Moreover, the high mobility in poly-Si TFTs can only be achieved at relatively high temperature (typically, beyond 500° C.). A similar trend also existed in CdSe based TFTs, in which high mobility is achieved when the active layer is formed (or post baked) over a certain temperature and when grain size becomes substantial compared to the channel length. Similarly, the characteristics of TFTs with microcrystalline semiconductor can vary, even between adjacent devices in an array, due to the fluctuation of grain boundaries and the size and number of crystalline grains at each TFT channel location. For example, in a conduction area under a sub-micron gate, each different TFT can include from one or two poly-silicon crystalline grains to several crystalline grains and the different number of crystals in the conduction area will produce different characteristics. The dimensions and their physical characteristics among different grains are also different.

It is known in the art that the channel length of presently standard thin film transistors is less than approximately 5 microns, especially for portable display applications. For purposes of this disclosure the term "amorphous" is defined as a material with grain size, along the channel length, much less than the channel length of presently standard thin film transistors, e.g. approximately 100 nanometers or less. In such a way, the number of grains in a channel area of $5 \times 5 = 25$ $\mu m^2$ is more than $10^3$, and the performance variation among different TFTs becomes negligible in practical applications. Thus, a MOTFT with a channel layer formed of amorphous or nanocrystalline metal oxide insures uniformity similar to a-Si TFT by having a very large number of grain boundaries which results in much smaller performance fluctuations between devices.

A typical MOTFT based on amorphous In—Ga—Zn—O has a mobility less than 15 $cm^2/Vs$. However, a high quality Poly-Si TFT has a mobility around 40 to 100 $cm^2/Vs$. Many display applications call for mobility and stability as good as those demonstrated by poly-Si TFTs. It would, therefore, make a MOTFT even more attractive to improve the mobility beyond 40 $cm^2/Vs$. In a MOTFT the mobility strongly depends on the volume carrier concentration of the channel layer. To achieve high mobility, the volume carrier concentration has to be equal to or greater than $10^{18}/cm^3$. But there is a constraint on how high the volume carrier concentration can be raised. In most applications, it is desirable to have a threshold voltage ($V_{th}$) close to zero and with a gate voltage in a range smaller than 20V. For instance, a TFT pixel driver for organic light emitting diodes (OLED) or inorganic LEDs typically operate in a desired range of 0-10V and in a 0-15V range for AMLCDs.

The charge under control by the gate voltage is $C_g(V_g - V_{th})$, where $C_g$ is the gate capacitance, $V_g$ is the gate voltage, and $V_{th}$ is the threshold voltage. So the volume carrier concentration is constrained by $C_g(V_g - V_{th})/d$, where d is the thickness of the carrier transport layer (MOTFT channel). To achieve a high mobility device, the thickness 'd' of the carrier transport layer should be made as small as possible. But the thickness d is constrained by the surface quality (such as roughness and uniformity) of the underlying substrate. Typical surface roughness under the channel layer is around 0.2-2 nm for the cases of dielectric layers on glass or polymer based substrates.

There are also other factors that must be considered in the case of using thin film carrier transport layers. For example, when the carrier transport layer is very thin, the stability may be or is easily compromised by the environment. First, during processing, the very thin active layer can be attacked and damaged or even destroyed by various processing materials. Second, even if one managed to avoid the issues prevalent in processing, the operating stability may be compromised if the very thin active layer is exposed to oxygen or water during device fabrication and operation.

It would be highly advantageous, therefore, to remedy the foregoing and other deficiencies inherent in the prior art.

Accordingly, it is an object of the present invention to provide a new and improved process for fabricating a stable high mobility metal oxide thin film transistor (MOTFT).

It is another object of the present invention to provide a new and improved process for fabricating a stable amorphous metal oxide thin film transistor (MOTFT) at low temperatures.

It is another object of the present invention to provide a new and improved process for fabricating a stable amorphous metal oxide thin film transistor (MOTFT) with a mobility at or above 40 $cm^2/Vs$.

It is another object of the present invention to provide a new and improved stable amorphous high mobility metal oxide thin film transistor (MOTFT).

SUMMARY OF THE INVENTION

The desired objects of the instant invention are achieved in accordance with a method of fabricating a stable high mobility amorphous MOTFT including the steps of providing a substrate with a gate formed thereon and a gate dielectric layer positioned over the gate. The method further includes the steps of depositing a carrier transport structure on the gate dielectric layer. The carrier transport structure includes a layer of amorphous high mobility metal oxide adjacent the gate dielectric and a protective layer of material relatively inert compared to the layer of metal oxide, and depositing source/drain contacts on the protective layer.

The desired objects of the instant invention are achieved in accordance with a specific method of fabricating a stable high mobility amorphous MOTFT including steps of providing a substrate with a gate formed thereon and a gate dielectric layer positioned over the gate. The method further includes a carrier transport structure deposited by sputtering on the gate dielectric layer. The carrier transport structure includes a layer of amorphous high mobility metal oxide adjacent the gate dielectric and a relatively inert protective layer of material deposited on the layer of amorphous high mobility metal oxide both deposited without oxygen and in situ. The layer of amorphous metal oxide has a mobility above 40 cm$^2$/Vs and a carrier concentration in a range of approximately $10^{18}$ cm$^{-3}$ to approximately $5\times10^{19}$ cm$^{-3}$. Source/drain contacts are positioned on the protective layer and in electrical contact therewith.

The desired objects of the instant invention are also achieved in accordance with a specific embodiment of a stable high mobility amorphous MOTFT including a substrate with a gate formed thereon and a gate dielectric layer positioned over the gate. A carrier transport structure is sputtered on the gate dielectric layer. The carrier transport structure includes a layer of amorphous high mobility metal oxide adjacent the gate dielectric with a thickness in a range of equal to or less than approximately 5 nm and preferably approximately 2 nm, a protective layer of relatively inert material deposited on the layer of amorphous high mobility metal oxide with a thickness in a range of equal to or less than approximately 50 nm, and the layer of amorphous metal oxide having a mobility above 40 cm$^2$/Vs and a carrier concentration in a range of approximately $10^{18}$ cm$^{-3}$ to approximately $5\times10^{19}$ cm$^{-3}$. Source/drain contacts are positioned on and in electrical contact with the protective layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Mobility in metal oxide semiconductors strongly depends on the volume carrier density. In order to achieve high mobility for high performance applications, the volume carrier density of the metal oxide channel is high. Traditionally, the volume carrier concentration in metal oxide is controlled by oxygen vacancies. Therefore, it is essential for high mobility MOTFTs that the concentration of the oxygen vacancies in the carrier transport layer (MOTFT channel), be as high as possible and that the oxygen vacancies not be reduced during processing or thereafter.

Figure 1:
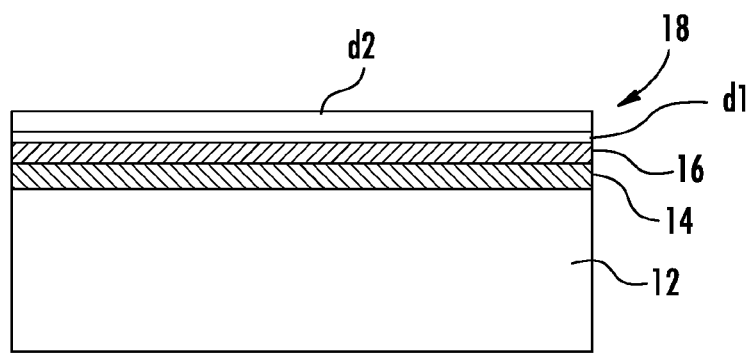
FIG. 1 shows a simplified layer diagram illustrating several steps in a process of fabricating a high mobility stable amorphous metal oxide transport layer for use in a high mobility metal oxide thin film transistor (MOTFT), in accordance with the present invention.

Referring to FIG. 1, several steps are illustrated in a process of fabricating a high mobility stable transport structure. Initially a substrate 12 is provided, which may be any convenient supporting material and in a preferred embodiment is a material transparent to a radiation wavelength used in a self-alignment procedure, or transparent in the case of bottom emission light emitting displays or transmissive liquid crystal displays. Typical materials for the transparent substrate 12 include glass, plastic film, etc. In applications that do not require substrate transparency, polished stainless-steel sheets can also be used. Substrate 12 can be in rigid, conformable, or flexible forms. Fabrication of MOTFTs on a thin flexible plastic substrate requires all process temperatures below its glass temperature, Tg (above which permanent deformation occurs so that pattern alignment among different layers becomes impractical). Tg in typical polymer substrates are in a 160° C. (PET)-390° C. (PI) range.)

A gate metal layer 14 is deposited on the surface of substrate 12 in any well known manner. A thin layer 16 of gate dielectric material is formed over gate metal 14 and may be any convenient material that provides the desired dielectric constant for TFT operation. Suitable materials for the gate dielectric layer include $SiO_2$, SiN, $Al_2O_3$, AlN, $Ta_2O_5$, $TiO_2$, ZrO, HfO, SrO, or their combinations in blend or multiple layer form. In addition to conventional forming methods (such as PECVD, PVD, etc.) the metal-oxide dielectric above can also be made with surface oxidation from the corresponding metal. Examples of surface oxidation include heating in oxygen-rich ambient, anodization, or their combination in sequence.

A carrier transport structure 18 includes a lower active transport layer d1 of semiconductor metal oxide deposited over the upper surface of layer 16 and a protective layer d2 deposited directly on layer d1. As is explained in more detail below, layer d2 is deposited right after layer d1 without breaking vacuum in the deposition chamber so that for purposes of this disclosure layers d1 and d2 are considered in combination as a carrier transport structure. In addition to depositing d1 and d2 layers without a vacuum break, it is discovered that sputter depositing the layers without oxygen presence is preferred to achieve the high carrier mobility as is described in more detail presently.

The best materials for active transport layer d1 are transparent metal oxide semiconductors such as indium-tin-oxide (ITO), indium oxide (InO), tin oxide (SnO), cadmium oxide (CdO), zinc oxide (ZnO), indium-zinc-oxide (IZO), and the like. Composite films comprising multiple metal-oxide compositions listed above can also be used. Control of chemical purity and intentional chemical doping can optimize the carrier mobility at the desired carrier concentration level. With carrier transport structure 18, as disclosed herein, along with the proper selection of the dielectric constant of the gate dielectric material forming layer 16, a MOTFT with a carrier concentration in active transport layer d1 as high as $5\times10^{19}$ cm$^{-3}$ can be fabricated with effective current switching between source and drain electrodes. In the preferred embodiment the carrier concentration in active transport layer d1 is in a range of approximately $10^{18}$ cm$^{-3}$ to approximately $5\times10^{19}$ cm$^{-3}$.

As explained above, to achieve a high mobility device, the thickness of the carrier transport layer should be made as small as possible. In the present embodiment the thickness of active transport layer d1 is in a range of less than approximately 5 nm and may conveniently be as low as approximately 2 nm.

Factors that must be considered in the case of using very thin film carrier transport layers are, for example, the stability may be or is easily compromised by the environment and by subsequent processing steps. In order to avoid degrading processing stability and operating stability, thin transport layer d1 has to be protected by some more inert layer, such as protective layer d2. Here the term "inert" is defined to mean that layer d2 has a much lower carrier mobility and carrier concentration, or is either an insulating material or is much closer to an insulating material. Protective layer d2 is preferably deposited directly on and substantially in the same deposition process (i.e. in situ or without breaking vacuum in the deposition chamber) as thin transport layer d1. By depositing layer d2 directly on layer d1, thin transport layer d1 is not exposed to ambience or processing chemicals. The best materials to use in protective layer d2 are metal oxides that are more inert than transport layer d1, such as M-Zn—O or M-In—O or their combination in which M includes at least one of Al, Ga, Ta, Ti, Si, Ge, Sn, Mo, W, Cu, Mg, V, Zr, or the like, with sufficient M content to ensure a desired inert state. The M component possesses generally higher bonding strength to oxygen that makes the protection layer d2 substantially more inert than the D1 layer. While the listed oxides are less conductive than thin transport layer d1, they are still sufficiently conductive vertically to allow metal S/D contacts to be deposited on protective layer d2 without the need for etching. In fact, it has been found that the deposition of contact metal on protective layer d2 will attract oxygen from protective layer d2 so that a good ohmic contact is the result even if protective layer d2 is inert because of some of the following process steps.

It is worth mentioning that in the case of a thin d1 layer (such as with a nominal thickness close to 2 nm), the bilayer structure and the corresponding carrier transport within the bilayer structure guarantees uniform conduction over large substrate areas even on a gate insulator with a relatively rough surface.

It will be understood that in the preferred fabrication process thin amorphous transport layer d1 is deposited by sputtering at low temperatures, preferably room temperature but no more than 160° C. Such low temperature process enables the TFT disclosed in this invention to be made on plastic substrates (such as PET, PEN, PAN, PAS, PI, etc). In order to maximize the mobility, the residual carrier concentration in the thin transport layer d1 should be as high as possible. To aid in achieving this result, in a preferred deposition of thin transport layer d1 no oxygen is introduced in the sputtering process. In a sputtering process incorporating oxygen, the oxygen is negative charged by the deposition system and accelerated toward the substrate. In the prior art, when making metal-oxide based TFTs, artisans introduced oxygen during sputter deposition to reduce carrier concentration to below $10^{17}$ $cm^3$ and move the threshold voltage of the MOTFT toward a more positive direction, the accelerated oxygen ions damage the forming film and result in defects and metastable states in the film. All the factors produced by the introduction of oxygen in the sputtering process contribute to low carrier mobility and positive bias stress instability, which have been observed generally in the field.

In the prior art, it has also been known that many of the materials disclosed herein for the d1 layer were classically used for transparent conducting electrodes with thicknesses typically over 100 nm. Substrate heating is often used to optimize the conductivity. It is known that ultra-thin films less than 10 nm deposited under such conditions with even the same material composition typically results in low carrier concentration and low mobility.

In contrast, the oxygen-free sputter process disclosed in the present invention enables one to achieve the needed carrier concentration and high mobility with a nominal thickness for transport layer d1 thinner than 5 nm.

In the preferred embodiment and without breaking the vacuum in the sputter chamber, the inert metal oxide of protective layer d2 is deposited by sputtering directly on layer d1 at low temperatures, preferably room temperature, but no more than 160° C. Protective layer d2 is formed with a thickness in a range of up to approximately 20 nm or greater. In the step of depositing the inert metal oxide by sputtering the same problems are prevalent as discussed above for active layer d1. If oxygen is introduced into the sputtering gas, the negatively charged oxygen will be accelerated toward the substrate. Some of the accelerated oxygen may penetrate into active transport layer d1 and create metastable oxygen in active transport layer d1, resulting in mobility and stability degradation. Therefore, in the preferred process the inert metal oxide of protective layer d2 is deposited by sputtering without oxygen.

One possible problem that may arise from sputtering without oxygen is that protective layer d2 may become too conductive and move the threshold voltage of the MOTFT too negative. By annealing the structure in an oxidizing ambience at an elevated temperature (e.g. >160° C.) protective layer d2 can be oxidized to move the threshold toward the positive direction. The problem with annealing in ambient atmosphere is that the process will generally be too slow, especially for temperatures below 200° C. Therefore, the desired oxidized result is achieved in a two step process that is very effective at low temperatures (i.e. <160° C.)

In a first step of the oxidizing process, the surface of the inert metal oxide of protective layer d2 is treated by a chemically oxidizing process. In the second step, the surface oxygen is driven into protective layer d2 at an elevated temperature. It has been confirmed that by driving oxygen into protective layer d1 a MOTFT with a switch threshold voltage larger than 0V can be achieved at a temperature at or below approximately 160° C.

The forming of an oxygen source at the top surface of the metal oxide of protective layer d2 can include any one of a variety of possible options. The surface oxidizing can include, for example, the use of a high pressure (>100 mtorr) oxygen plasma that would not include any high energy ions that can generate a metastable state. Another oxidizing option is the use of a high pressure (>100 mtorr) $N_2O$ plasma. Another oxidizing option is the use of ultraviolet ozone. Yet another option is the coating of protective layer d2 with a self-assembled monolayer such as 4-chlorophenyl trichlorosilane (4-CPTS), chloromethyl trichlorosilane (CMTS), 4-chlorophenyl phosphonic acid (4-CPPA), 3-nitrophenyl phosphonic acid (3-NPPA), and 2-chloroethyl phosphonic acid (2-CEPA). Yet another option is the treating of the surface of protective layer d2 with concentrated hydrogen peroxide. Yet another option is the treating of the surface of protective layer d2 with a dichromate solution.

In any of the above oxygen treatment examples or others that may be devised, the purpose of the surface modification is to deposit a concentrated oxygen source/reservoir on the surface of protective layer d2 which is much more concentrated than the oxygen in the ambience. Such deposition process is done at low temperature, for example at room temperature without intentional substrate heating. Oxygen diffusion during this process is negligible. The concentrated oxygen source on the surface of protective layer d2 is then subjected to an elevated temperature (e.g. at ~160° C., or higher) which causes the oxygen to migrate into protective layer d2. The migration of oxygen into protective layer d2 makes the inert metal oxide more oxidized and moves the threshold voltage closer to zero. Since the process of driving the surface oxygen into protective layer d2 is thermally activated, the oxygen will stay in protective layer d2 because the composition of the inert metal oxide selected for protective layer d2 is more stable than the material forming active transport layer d1. The oxidizing process for protective layer d2 enables a lower elevated temperature step because of the very concentrated source of oxygen at the surface (i.e. the oxygen diffusion is concentration dependent).

The process above provides a method to make a high mobility, amorphous bi-layer on plastic substrates (such as PET, PEN, PAN, PAS, and PI). The maximum temperature of ~160° C. fits with PET substrates. For PEN, PAN, and PAS, the temperature for the diffusion process can be increased to a 180-220° C. range. For the case of a PI (polyimide) substrate or flexible glass substrate (such as Corning Willow glass series), higher treatment temperature can be chosen to reduce the process times. For the case with a borosilicate glass substrate, the treatment temperature can be selected in an even broader range. On the other hand, to retain the transport layer amorphous (i.e. with no crystal grain larger than 100 nm), the oxygen diffusion process is preferred to be carried out below 350° C.

It is worth noting that the greater tendency of oxidation in protective layer d2 with respect to transport layer d1 reduces carrier density and mobility in protective layer d2 and also depletes oxygen from transport layer d1 to improve the carrier concentration and mobility in transport layer d1. As a result, the field effect mobility in MOTFTs fabricated in accordance with the process disclosed in the present invention is substantially higher than was realized in the prior art devices in which thick transport oxide films were used for electrodes. For instance, a mobility over 90 cm$^2$/Vsec has been achieved in MOTFTs in which transport layer d1 is made of thin, amorphous In—Sn—O film (In2O3:SnO, weight ratio equals 90:10), in contrast to a 30-50 cm$^2$/Vsec observed in thick crystalline conducting electrode films with similar In—Sn—O composition.

Figure 2:
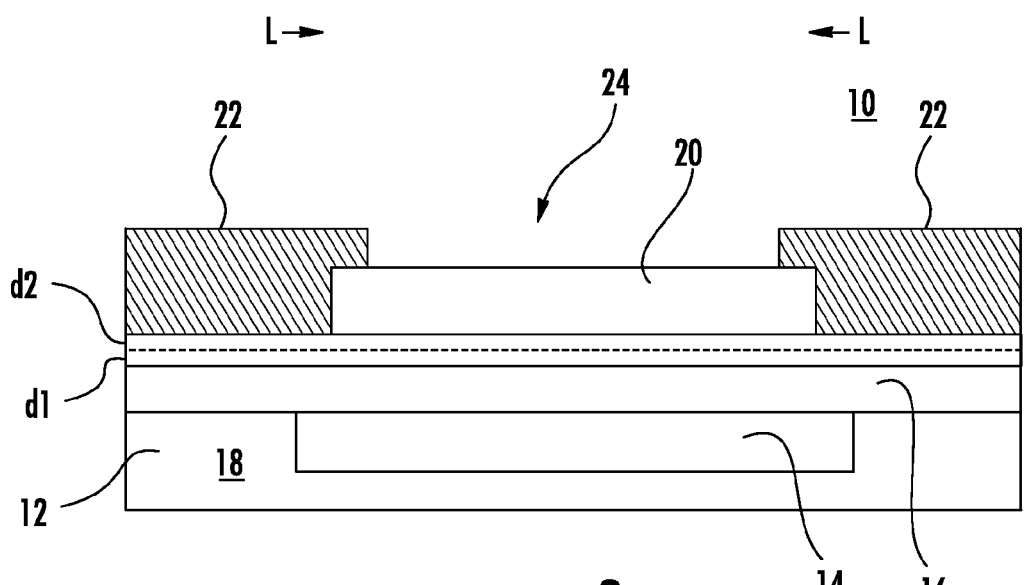
FIG. 2 illustrates an example of a stable high mobility metal oxide thin film transistor (defined as an "etch-stop" MOTFT) incorporating the high mobility stable transport layer of FIG. 1, in accordance with the present invention.

Turning specifically to FIG. 2, a high mobility stable, amorphous MOTFT 10, of the "etch-stop" MOTFT type, is illustrated. For purposes of this disclosure, MOTFT 10 is defined as an "etch-stop" MOTFT. A complete process for this fabrication technique can be found in a copending U.S. patent application entitled "Double Self-Aligned Metal Oxide TFT", filed May 26, 2011, bearing Ser. No. 13/116, 292, and incorporated herein by reference. MOTFT 10 includes transparent substrate 12, which may be any convenient material transparent to radiation (i.e. self-alignment exposure) wavelengths used in the self-alignment procedure, such as glass, plastic, etc. For the MOTFT to be used for opto-electric or electro-optic applications, transparency to wavelengths being used is also needed. For example, transparency in the visible range (400-700 nm) is required for display applications, or transparency from 200 nm-3200 nm is required for broadband image sensors. Gate metal layer 14 is patterned on the upper surface of substrate 12 by any convenient means. Since the position of gate metal layer 14 is not critical virtually any non-critical patterning technique can be used.

It will be understood by those of skill in the art that in addition to or instead of forming gate metal layer 14 with a physical vapor deposition process (such as sputter, a-beam, thermal deposition, etc.) and patterned by photolithography with a proximity or a projection tool, the gate layer can be formed with any of the various printing processes known to experts in the field, including ink jetting, dispensing, imprinting, transfer printing or off-set printing methods. The gate metal can also be formed with a plating method known in the art. In addition to or instead of using traditional photolithography layer 14 can also be patterned with laser writing lithography. While a single gate metal 14 (i.e. single MOTFT) is illustrated for convenience in understanding, it will be understood that this might represent one or more (even all) of the TFTs used in a backplane or other large area applications.

Thin layer 16 of gate dielectric material is formed over gate metal 14 and the surrounding area. For purposes of this disclosure the term "surrounding area" includes at least the area illustrated in FIG. 2 (i.e. the gate and channel areas and the source/drain areas). Again, layer 16 may be a blanket layer covering the entire large area application and no alignment is required. The gate dielectric material may be any convenient material that provides the desired dielectric constant for TFT operation. Typical inorganic materials include $SiO_2$, SiN, $Al_2O_3$, $Ta_2O_5$, $TiO_2$, $HfO_2$, $ZrO_2$, SrO and the like. Organic dielectrics can also be used for layer 16. For example, a metal-oxide TFT with organic gate dielectric is disclosed in U.S. Pat. No. 7,772,589. In addition to single compounds, gate dielectric layer 16 can be constructed with these materials in mixed composite form, or in a multiple-layer stack.

Carrier transport structure 18, including the amorphous semiconductor metal oxide bilayer di/d2, is deposited over the upper surface of layer 16. As mentioned earlier, typical materials for active transport layer d1 are transparent metal oxide semiconductors such as indium-tin-oxide (ITO), indium oxide (InO), tin oxide (SnO), cadmium oxide (CdO), zinc oxide (ZnO), indium-zinc-oxide (IZO), and the like. Composite films comprising multiple metal-oxide components listed above can also be used. A desired carrier concentration can be achieved by chemical doping and by the bilayer d1/d2 structure deposited by a sputter process sequentially in an oxygen-free environment and without substrate heating. It should be noted that, although the completed d2 layer is more inert chemically and more resistive electrically, the pristine deposited d2 layer in an oxygen-free environment is selected (through the proper selection of the metal components) to have a higher tendency to attract oxygen from both the top surface and the bottom surface contacting layer d1. Attracting oxygen from active transport layer d1 results in optimized carrier concentration and carrier mobility in active transport layer d1.

Carrier transport structure 18 can then be patterned with standard photolithography and a surface oxidation process is performed followed with an oxygen diffusion process at an elevated temperature. The resulting structure 18 is amorphous/nanocrystalline without crystalline structure beyond 100 nm.

A passivation/etch-stop layer 20 is then deposited on carrier transport structure 18 and patterned. In addition to or instead of inorganic materials (such as $Al_2O_3$, $Ta_2O_5$, $TiO_2$, SiN, and $SiO_2$), a photo-patternable organic material can also be used for the layer 20. The selection principle for layer 20 is that the material and the corresponding forming process do not create damage in the underlying carrier transport structure 18. U.S. Pat. Nos. 7,977,151 and 8,187,929 and U.S. patent application Ser. Nos. 13/115,749 and 13/718,813, incorporated herein by reference, disclose a series of such materials and processes.

Layer 20 is used as an etch stop/passivation layer during the following processes. The patterning can be accomplished with regular photolithography or by a self-aligned process using the gate pattern as a built-in mask. Details on the self-aligned process are disclosed in U.S. Pat. Nos. 7,605,026 and 7,977,151.

The source/drain areas 22 can be formed by physical vapor deposition and by standard etching methods known to artisans in the field. Areas 22 can alternatively be formed with self-aligned process by means of gate layer pattern and a non-crucial lithography mask, or by means of an add-on/printing method (such as plating) as disclosed in U.S. Pat. No. 7,977,151 and U.S. patent application Ser. No. 13/406,824. The space between the source and drain, i.e. etch stop/passivation layer 20, defines the conduction channel, designated 24, for MOTFT 10.

Optional cleaning/treatment/etching processes (with plasma or chemical treating) could be inserted after the processing of etch stop/passivation layer 20 and before deposition of source/drain areas 22 to improve the electrical contact between carrier transport structure 18 and S/D electrodes (source/drain areas 22). Etch stop/passivation layer 20 provides the needed protection to the channel area during these processes.

Figure 3:
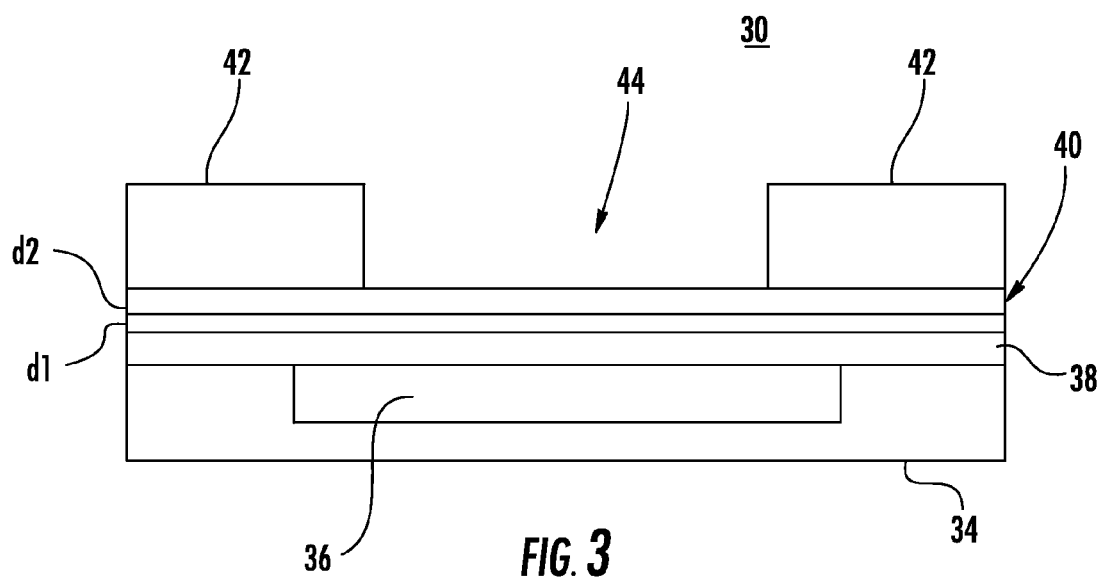
FIG. 3 illustrates an example of another stable high mobility metal oxide thin film transistor (defined as a "back-channel etch" MOTFT) incorporating the high mobility stable transport layer of FIG. 1, and the source/drain contacts positioned on and in electrical contact with the protective layer in accordance with the present invention.

Turning to FIG. 3, another metal oxide thin film transistor (MOTFT) 30 is illustrated in accordance with the present invention. In this example, MOTFT 30 includes a substrate 34 with a bottom gate 36 formed thereon and a gate dielectric layer 38 overlying gate 36. An active layer 40 of metal oxide is formed on gate dielectric layer 38 and source/drain metal contacts 42 are positioned in a spaced apart relationship on active layer 40 to define a channel area therebetween in a well known manner. Active layer 40 is a carrier transport structure constructed similar to carrier transport structure 18 of FIG. 1 and includes a lower active transport layer d1 of high mobility amorphous semiconductor metal oxide deposited over the upper surface of layer 38 and a protective layer d2 deposited directly on layer d1. This type of MOTFT is known as a 'back-channel etch' MOTFT and illustrates that a stable high mobility amorphous MOTFT can also be fabricated using the back-channel-etching process.

Gate 36 and layers 38 and 40 are formed on substrate 34 as described above with respect to FIGS. 1 and 2. Source/drain metal contacts 42 are preferably formed by first depositing a blanket layer of contact metal. After blanket depositing the S/D metal layer, the layer is patterned by either a dry or wet etchant to open the channel area, designated 44. The surface of channel area 44 can be cleaned by a washing procedure and followed with a surface treatment procedure. In 'back-channel etch' MOTFT 30 configuration, channel area 44 is available for the step or steps of oxidation and oxygen drive-in after the S/D patterning and is preferred at this point in the fabrication process. The greater tendency of oxidation in protective layer d2 with respect to transport layer d1 protects layer d1 during the S/D deposition and patterning process and the subsequent step or steps of oxidation and oxygen drive-in ensures the desired carrier concentration and mobility in channel area 44.

For certain applications, such as the configuration of FIG. 3, additional organic/inorganic passivation layer(s) and electrode layers may be needed subsequent to the formation and patterning of the S/D layer. Due to the improved chemical resistance disclosed in this invention, a larger process window, more process methods, and broader material selection can be used for the following processes.

Figure 4B:
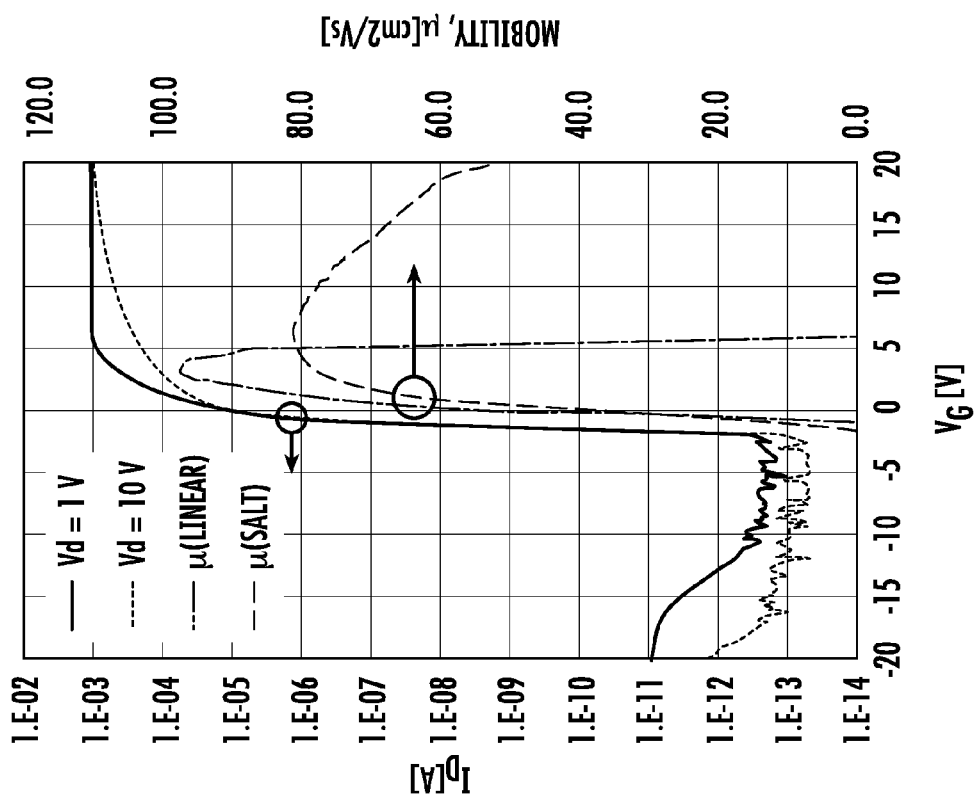
FIG. 4 illustrates graphically Id-Vgs and mobility-Vgs data sets from the MOTFT disclosed in this invention. Data in FIG. 4A are from a MOTFT with etch-stop structure described in FIG. 2, and data in FIG. 4B are from a MOTFT with back-channel-etching structure illustrated in FIG. 3.
Figure 4A:
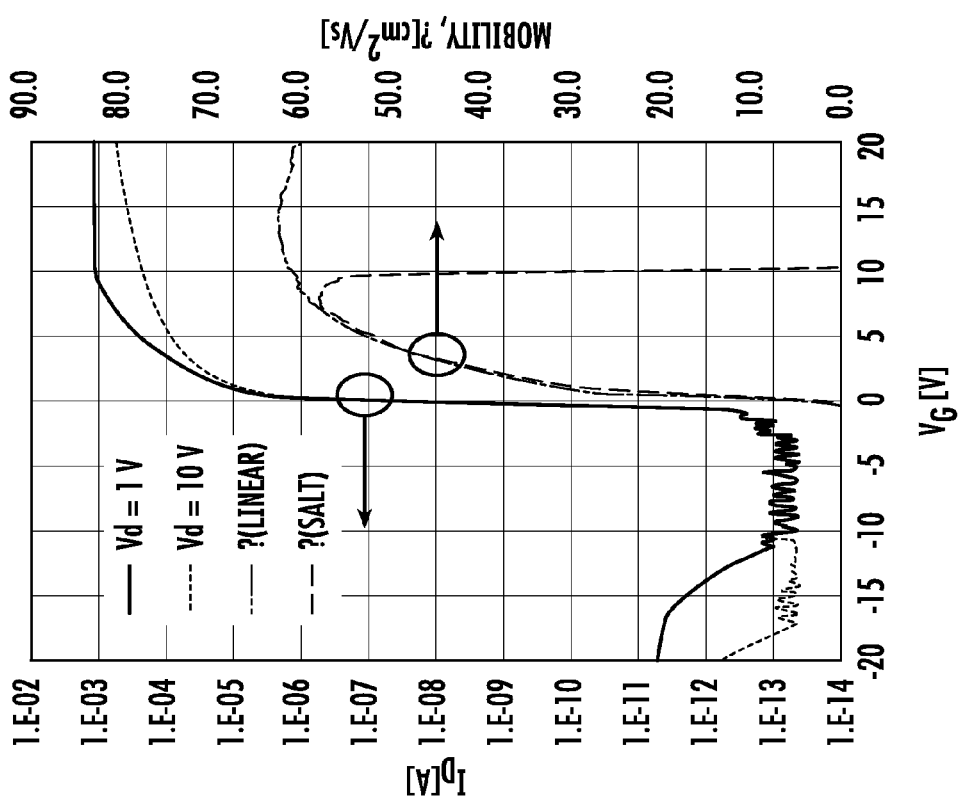

Referring to FIG. 4, two typical Id-Vgs data sets are illustrated from MOTFTs fabricated in accordance with the present invention. Referring specifically to FIG. 4A, a data set is illustrated from a TFT with etch-stop structure as described in conjunction with FIG. 2. Referring specifically to FIG. 4B, a data set is illustrated from a TFT with BCE structure as described in conjunction with FIG. 3. The Id-Vgs data were taken at Vds=1V and 10V at room temperature. The corresponding linear mobility and saturate mobility are also shown at the right side of each FIG. The gate metal for these TFTs was an Al—Nd alloy. The gate insulator was formed by surface anodization at room temperature. The transport layer was ITO with an In:Sn ratio of 90:10. The thickness of layer d1 was 2.5 nm. Protection layer d2 was In—Al—Zn—O with a thickness of 30 nm. Layers d1 and d2 were deposited by sputtering without oxygen at room temperature. An oxygen source zone was formed at the surface of layer d2 by means of oxygen plasma as disclosed above. A process of driving the oxygen into layer d2 from the oxygen source zone was carried out at 300° C. for 30 minutes. A photopatternable polyimide was used as the passivation/etch-stop layer 20 in FIG. 2. For the TFT with BCE structure, the oxygen surface forming and driving-in processes were carried out after S/D deposition and patterning.

The current switch voltage is close to 0V. Sub-threshold voltage swing is −0.1V, as good as that in high-end LTPS-TFT. The Ion/Ioff ratio reaches $10^{10}$ at Vgs=+/−10V. For the TFT with etch-stop structure (FIG. 4A), linear mobility reaches 62 $cm^2$/Vsec at Vgs=12V, and saturation mobility reaches 58 $cm^2$/Vsec at Vgs=8V. For the TFT with BCE structure (FIG. 4B), linear mobility reaches 82 $cm^2$/Vsec at Vgs=6V, and saturation mobility reaches 97 $cm^2$/Vsec at Vgs=3V-4V.

These data sets represent one of the best performance ever seen in thin film devices. The ON current in forward bias reaches a level only seen in poly-Si TFTs, or Poly-CdTe TFTs. The OFF currents in reverse bias, on the other hand, are substantially better than in Poly-Si TFTs. These data sets are as good as the best numbers seen in amorphous silicon devices. The data illustrated in FIG. 4, in fact, are comparable to those only seen in MOSFET devices made on crystalline semiconductor wafers.

Moreover, TFTs made with the fabrication methods disclosed in this invention show superb stability. The Vth shift under DC forward bias stress tested at Vgs=+20V, Vds+0.1V at 60° C., for 2 hours was less than 0.7V, and the Vth shift under DC negative biasing stress at Vgs=−20V, Vds+0.1V at 60° C. for 2 hours was −0.3V. Current stress at 300 µA initial current (under Vgs=Vds=5V) at 60° C. over 60 hours revealed a stable operation lifetime: Vth only shifted less than 0.5V over the entire test. The total charge passing through the TFT was over 70 Coulombs. Such performance enables high frame rates and pixel density in active matrix displays both AMLCD and AMOLED/AMLED. For LCD applications, TFT stability under backlight illumination also needs to be considered. Such bilayer channel structure has intrinsic stability under white light illumination. Experimental test results under a backlight unit with light intensity close to that in LCD TV and portable device applications confirmed the stability shifts less than 1V after 2 hours of testing.

The mobility beyond 40 $cm^2$/Vsec, enables displays with 8000 columns and 4000 rows with frame rates up to 480 Hz. The high bias stability and current operation stability, enables pixel driver circuits in active display areas and column/row drivers in peripheral areas.

Such high mobility and stability MOTFT can also be used for thin film electronics beyond display arrays. Examples include high pixel density and high frame rate imager sensor arrays, pressure sensor arrays, touch sensor arrays, chemical sensor arrays, or biosensor arrays. The process method and thin film process tools for large size substrates enables many applications in-capable with electronic circuits based on silicon wafers.

Figure 5:
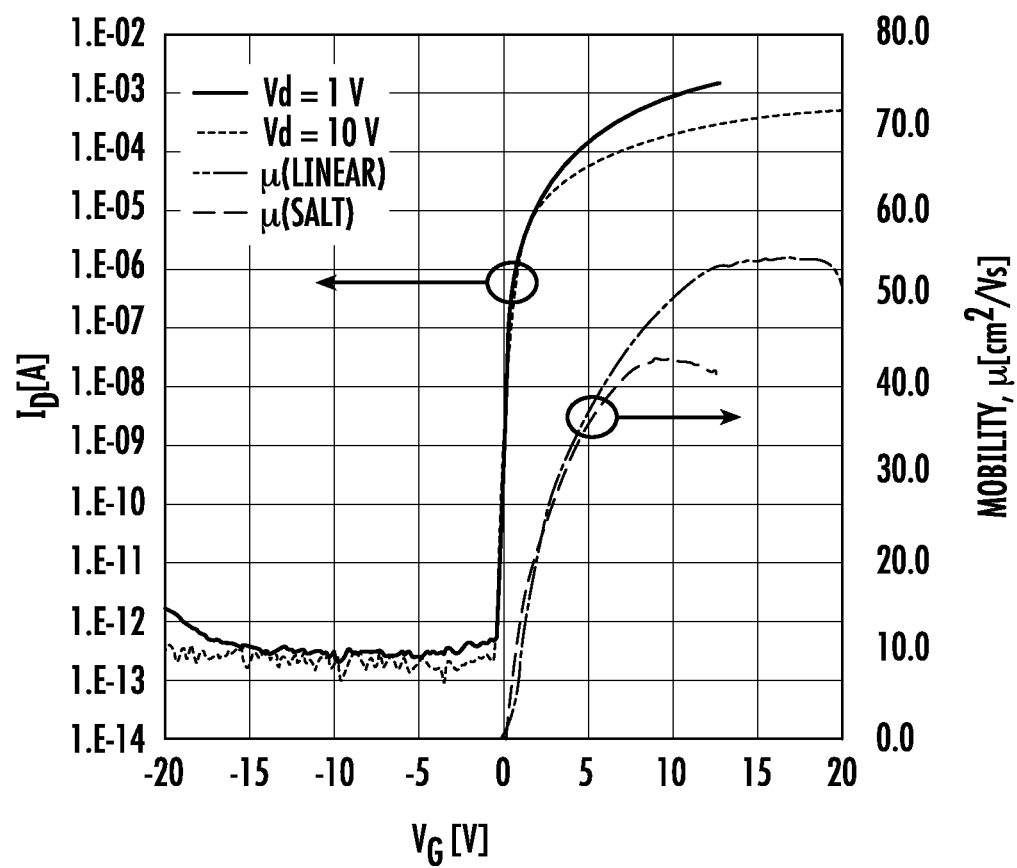
FIG. 5 illustrates graphs of Id-Vgs and mobility-Vgs curves from a MOTFT made in accordance with the present invention on a flexible PET substrate.

Referring to FIG. 5, graphs of Id-Vgs and mobility-Vgs curves from a MOTFT made on a flexible PET substrate are illustrated. The MOTFT from which the graphs of FIG. 5 were generated was made with BCE structure as shown in FIG. 3. All the fabrication processes including oxygen driving-in baking were carried out at temperatures below or equal to 160° C. Linear mobility reaches ~55 cm$^2$/Vsec at Vgs=15V, and saturation mobility reaches 43 cm$^2$/Vsec at Vgs near 10V. The biasing stability and current operation stability are close to that shown in the examples above.

Thus, a new and improved process for fabricating a stable high mobility metal oxide thin film transistor (MOTFT) is disclosed. Further, the new and improved process for fabricating a stable amorphous metal oxide thin film transistor (MOTFT) describes the fabrication of a MOTFT with mobility at or above 40 cm$^2$/Vs. Also, a new and improved stable amorphous high mobility metal oxide thin film transistor (MOTFT) is disclosed. The fabrication process includes steps for depositing a carrier transport structure with a high mobility layer and a relatively inert protective layer deposited in situ with the high mobility layer to protect the high mobility layer from damage due to subsequent processing steps and ambient gasses. Also, the MOTFT is fabricated at room temperature and no greater than 160° C. Further, in the steps of depositing a carrier transport structure with a high mobility layer and a relatively inert protective layer, no oxygen is present.

While the examples described include various transparent and opaque layers for purposes of self-alignment, it will be understood that if self-alignment is not used in the fabrication process the various layers may be transparent or opaque depending upon the specific material used in the formation thereof and the application of the final product. The various applications require no transparency from the substrate so that, for example, flexible stainless steel foil can be used as the substrate material. Also, the MOTFT disclosed in this invention enables conformable or flexible electronic devices and apparatus.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a stable high mobility amorphous MOTFT comprising the steps of:
   providing a substrate with a gate formed thereon and a gate dielectric layer positioned over the gate;
   depositing a carrier transport structure on the gate dielectric layer, the carrier transport structure including a layer of amorphous high mobility metal oxide adjacent the gate dielectric and a protective layer of material relatively inert compared to the layer of metal oxide;
   forming an oxygen-rich zone adjacent a top surface of the protective layer at approximately room temperature, including coating with an oxygen-rich self-assembled layer comprising one of 4-chlorophenyl trichlorosilane (4-CPTS), chloromethyl trichlorosilane (CMTS), 4-chlorophenyl phosphoric acid (4-CPPA), 3-nitrophenyl phosphonic acid (3-NPPA), 2-chloroethyl phosphonic acid (2-CEPA), or their combination; and
   driving oxygen into the protective layer at an elevated temperature below approximately 350° C.

2. The method as claimed in claim 1 further including the steps of:
   defining a channel area overlying the gate in the layer of amorphous high mobility metal oxide;
   forming an etch-stop layer overlying the channel area subsequent to the driving oxygen step;
   defining source/drain contact areas on opposed sides of the channel area;
   performing a cleaning and/or treatment and/or etching step on the surface of the source/drain contact areas; and
   depositing and patterning source/drain contacts on the protective layer in the source/drain contact areas.

3. The method as claimed in claim 1 further including, prior to the step of forming an oxygen-rich zone, the steps of:
   defining a channel area overlying the gate in the layer of amorphous high mobility metal oxide;
   defining source/drain contact areas on opposed sides of the channel area;
   depositing a blanket metal layer on the protective layer; and
   patterning the blanket metal layer to form source/drain electrodes in the source/drain areas and to open an area between the source/drain electrodes overlying the channel area.

4. The method as claimed in claim 1 wherein the step of depositing a layer of amorphous high mobility metal oxide includes depositing a layer of amorphous metal oxide with a mobility above 40 cm$^2$/Vs.

5. The method as claimed in claim 1 wherein the step of depositing a layer of amorphous high mobility metal oxide includes depositing a layer of amorphous metal oxide with a carrier concentration in a range of approximately $10^{18}$ cm$^{-3}$ to approximately $5 \times 10^{19}$ cm$^{-3}$.

6. The method as claimed in claim 1 wherein the step of depositing the layer of amorphous high mobility metal oxide includes depositing one of indium-tin-oxide (ITO), indium oxide (InO), tin oxide (SnO), cadmium oxide (CdO), zinc oxide (ZnO) indium-zinc-oxide (IZO), or zinc oxide (ZnO), or a composite film including more than one of the above metal-oxides.

7. The method as claimed in claim 1 wherein the step of depositing the layer of amorphous high mobility metal oxide includes depositing a layer with a thickness in a range of equal to or less than approximately 5 nm.

8. The method as claimed in claim 1 wherein the step of depositing the protective layer includes depositing a layer including metal oxides that are more inert than the amorphous high mobility metal oxide layer.

9. The method as claimed in claim 8 wherein the step of depositing the more inert metal oxide includes depositing a layer of one of M-Zn—O, M-In—O, or their combination, where M includes at least one of Al, Ga, Ta, Ti, Si, Ge, Sn, Mo, W, Cu, V, or Zr.

10. The method as claimed in claim 1 wherein the step of depositing the protective layer includes depositing a layer with a thickness in a range of 20 nm-50 nm.

11. The method as claimed in claim 1 wherein the step of depositing the carrier transport structure includes depositing the layer of amorphous high mobility metal oxide and the protective layer in situ, without a vacuum break.

12. The method as claimed in claim 1 wherein the step of depositing the carrier transport structure includes depositing the layer of amorphous high mobility metal oxide and the protective layer at a temperature below 160° C.

13. The method as claimed in claim 1 wherein the step of depositing the carrier transport structure includes depositing the layer of amorphous high mobility metal oxide and the protective layer by sputtering.

14. The method as claimed in claim 13 wherein the step of depositing the layer of amorphous high mobility metal oxide and the protective layer by sputtering without oxygen.

15. The method as claimed in claim 1 wherein the step of forming the oxygen-rich zone further includes using oxygen plasma, $N_2O$ plasma, a UV-ozone process, surface treatment with hydrogen-peroxide or a dichromate solution, or a combination process thereof.

16. The method as claimed in claim 15 wherein the step of forming the oxygen-rich zone is performed at a temperature below 160° C.

17. The method as claimed in claim 15 wherein the step of forming the oxygen-rich zone is performed at a pressure below 100 mtorr.

18. The method as claimed in claim 1 wherein the step of driving oxygen from the oxygen source into the protective layer includes using an elevated temperature equal to or greater than 160° C.

19. The method as claimed in claim 1 wherein the step of providing the substrate includes providing a substrate including one of glass, plastic film, and stainless steel film each in one of rigid, conformable, or flexible form.

20. The method as claimed in claim 1 wherein the step of providing the gate dielectric layer includes providing a layer including $SiO_2$, SiN, $Al_2O_3$, AlN, $Ta_2O_5$, $TiO_2$, ZrO, HfO, SrO, or their combinations in blend or multiple layer form.

21. The method as claimed in claim 20 wherein the step of providing the gate dielectric layer includes forming the gate dielectric layer by anodization, by heating under oxygen-rich ambient, or combinations thereof in sequence from the corresponding metal.

22. A method of fabricating a stable high mobility amorphous MOTFT comprising the steps of:
providing a substrate with a gate formed thereon and a gate dielectric layer positioned over the gate;
depositing by sputtering a carrier transport structure on the gate dielectric layer without intentional substrate heating or with intentional cooling, the carrier transport structure including a layer of amorphous high mobility metal oxide adjacent the gate dielectric and a protective layer of material deposited on the layer of amorphous high mobility metal oxide both deposited without oxygen and in situ, the protective layer being relatively inert compared to the layer of amorphous high mobility metal oxide;
forming an oxygen-rich zone at the upper surface of the protective layer at a temperature below 160° C.
driving oxygen into the protective layer from the oxygen-rich zone at an elevated temperature; and
the resulting layer of amorphous metal oxide having a mobility above 40 $cm^2$/Vs and a carrier concentration in a range of approximately $10^{18}$ $cm^{-3}$ to approximately $5 \times 10^{19}$ $cm^{-3}$.

23. The method as claimed in claim 22 further including the steps of:
defining a channel area overlying the gate in the layer of amorphous high mobility metal oxide;
forming an etch-stop layer overlying the channel area subsequent to the driving oxygen step;
defining source/drain contact areas on opposed sides of the channel area;
performing a cleaning and/or treatment and/or etching step on the surface of the source/drain contact areas; and
depositing and patterning source/drain contacts on the protective layer in the source/drain contact areas.

24. The method as claimed in claim 22 further including, prior to the step of forming an oxygen-rich zone, the steps of:
defining a channel area overlying the gate in the layer of amorphous high mobility metal oxide;
defining source/drain contact areas on opposed sides of the channel area;
depositing a blanket metal layer on the protective layer; and
patterning the blanket metal layer to form source/drain electrodes in the source/drain areas and to open an area between the source/drain electrodes overlying the channel area.

25. The method as claimed in claim 22 wherein the step of depositing the layer of amorphous high mobility metal oxide includes depositing a layer with a thickness in a range of equal to or less than approximately 5 nm.

26. The method as claimed in claim 22 wherein the step of depositing the protective layer includes depositing a layer with a thickness in a range of 20 nm-50 nm.

* * * * *